US012132302B2

(12) United States Patent
Isaji et al.

(10) Patent No.: US 12,132,302 B2
(45) Date of Patent: Oct. 29, 2024

(54) CIRCUIT ASSEMBLY

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yusuke Isaji, Mie (JP); Hitoshi Takeda, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 209 days.

(21) Appl. No.: 17/758,750

(22) PCT Filed: Jan. 12, 2021

(86) PCT No.: PCT/JP2021/000626
§ 371 (c)(1),
(2) Date: Jul. 13, 2022

(87) PCT Pub. No.: WO2021/153206
PCT Pub. Date: Aug. 5, 2021

(65) Prior Publication Data
US 2023/0039051 A1 Feb. 9, 2023

(30) Foreign Application Priority Data
Jan. 30, 2020 (JP) .................................. 2020-014099

(51) Int. Cl.
*H02G 3/16* (2006.01)
*B60R 16/023* (2006.01)
(Continued)

(52) U.S. Cl.
CPC ........... *H02G 3/16* (2013.01); *B60R 16/0238* (2013.01); *H01H 50/047* (2013.01); *H02G 3/081* (2013.01); *H05K 7/02* (2013.01)

(58) Field of Classification Search
CPC ...... H02G 3/16; H02G 3/081; B60R 16/0238; B60R 16/0239; H01H 50/047; H05K 7/02; H01R 9/18; H01R 4/305; H01R 11/12
See application file for complete search history.

(56) References Cited

U.S. PATENT DOCUMENTS

| 7,918,692 B1* | 4/2011 | Hertzler | ............... H01R 9/2408 |
| | | | 439/810 |
| 2015/0263442 A1* | 9/2015 | Bakatsias | ............... H01R 12/75 |
| | | | 439/78 |

(Continued)

FOREIGN PATENT DOCUMENTS

| JP | 2014-212608 | 11/2014 |
| JP | 2019-103383 | 6/2019 |
| JP | 2020-061915 | 4/2020 |

OTHER PUBLICATIONS

International Search Report issued in International Bureau of WIPO Patent Application No. PCT/JP2021/000626, dated Apr. 13, 2021, along with an English translation thereof.

*Primary Examiner* — Steven T Sawyer
(74) *Attorney, Agent, or Firm* — Greenblum & Bernstein, P.L.C.

(57) ABSTRACT

Disclosed is a circuit assembly having a novel structure that enables circuit components to be laid out in a lower case with high design flexibility and higher spatial efficiency. A circuit assembly includes: a lower case for accommodating lower circuit components; an upper case for covering the lower case; upper circuit components attached to the upper case, and a fastening member holder for holding a fastening (Continued)

member for fixing the upper circuit components to the upper case, the fastening member holder being provided in the upper case.

7 Claims, 6 Drawing Sheets

(51) Int. Cl.
  *H01H 50/04* (2006.01)
  *H02G 3/08* (2006.01)
  *H05K 7/02* (2006.01)

(56) References Cited

U.S. PATENT DOCUMENTS

| | | | |
|---|---|---|---|
| 2018/0026381 A1* | 1/2018 | Haraguchi | H05K 7/1432 |
| | | | 439/76.2 |
| 2018/0212345 A1* | 7/2018 | Boisnier | H01R 9/223 |
| 2018/0326924 A1* | 11/2018 | Haraguchi | H02G 3/16 |
| 2019/0174647 A1 | 6/2019 | Umeda et al. | |
| 2019/0297720 A1* | 9/2019 | Fujimura | H05K 1/0204 |
| 2020/0118778 A1 | 4/2020 | Oda et al. | |

* cited by examiner

CIRCUIT ASSEMBLY

TECHNICAL FIELD

The present disclosure relates to a circuit assembly that includes an upper case and a lower case.

BACKGROUND ART

Vehicles are conventionally equipped with circuit assemblies that have circuit components arranged at appropriate locations in upper cases and lower cases. For example, Patent Document 1 discloses a circuit assembly that includes an upper case to which a relay or the like that generates a large amount of heat is attached, and a lower case in which fastening member holders or the like are arranged that hold fastening members, which are used to fix a current-carrying bus bar that is part of a circuit and the relay or the like attached to the upper case.

CITATION LIST

Patent Documents

Patent Document 1: JP 2014-212608A

SUMMARY OF INVENTION

Technical Problem

The lower case of a circuit assembly having this type of conventional structure includes the fastening member holders. This limits the space for arranging circuit components in the lower case. Further improvements have therefore been required to reduce the circuit assembly size and effectively lay out the circuit components in the lower case.

A circuit assembly having a novel structure will be disclosed that enables circuit components to be laid out in the lower case with high design flexibility and higher space efficiency.

Solution to Problem

A circuit assembly of the present disclosure is a circuit assembly including: a lower case for accommodating lower circuit components; an upper case covering the lower case; upper circuit components attached onto an upper wall of the upper case; and a fastening member holder for holding a fastening member for fixing the upper circuit components to the upper wall of the upper case, the fastening member holder being provided in the upper wall of the upper case and opening upward.

Advantageous Effects of Invention

According to the present disclosure, a circuit assembly can be provided that enables circuit components to be laid out in the lower case with high design flexibility and higher spatial efficiency.

DESCRIPTION OF EMBODIMENTS

Description of Embodiments of Present Disclosure

Figure 1:
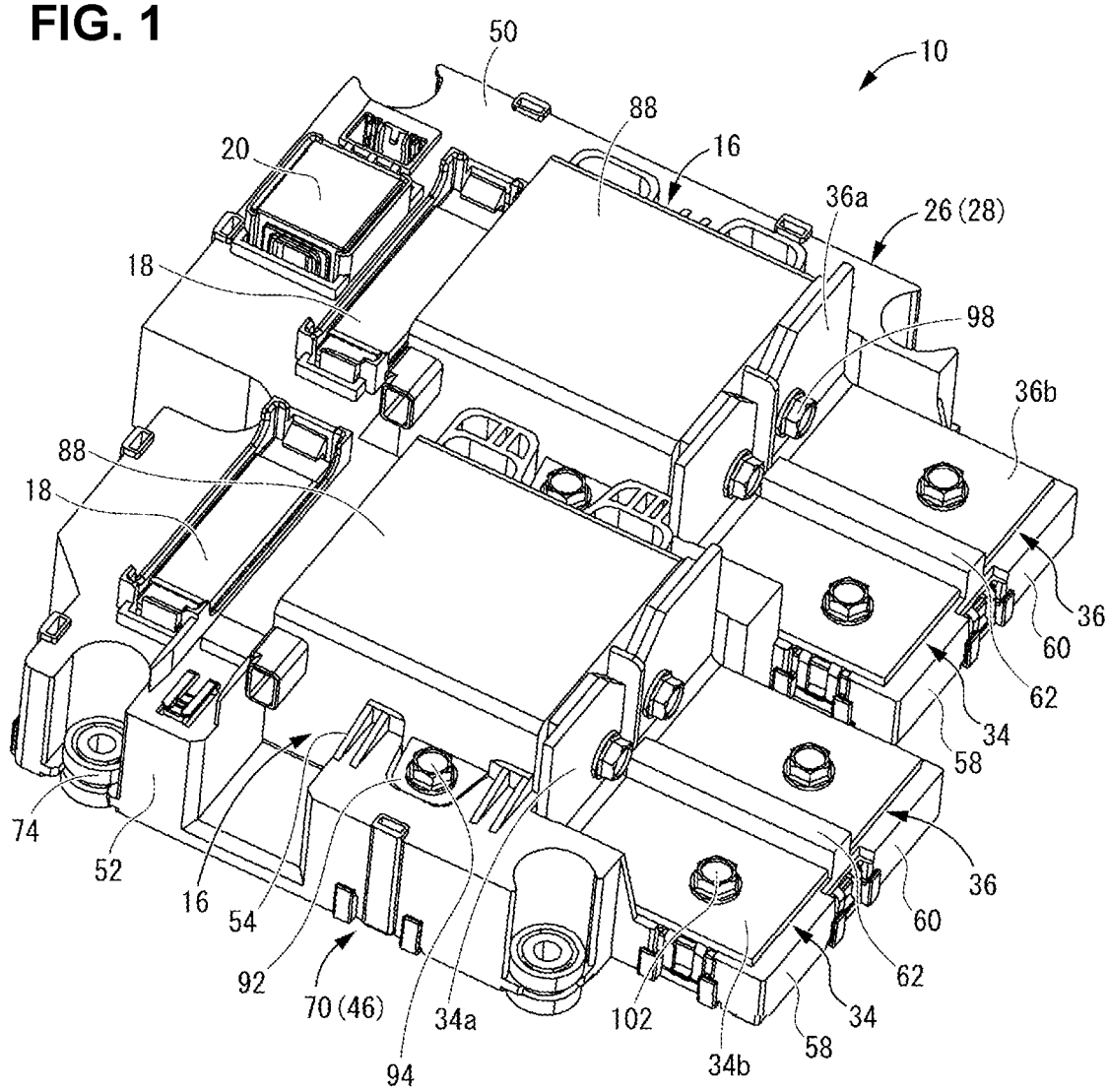
FIG. 1 is a perspective view of a circuit assembly according to Embodiment 1.
Figure 1:
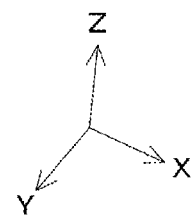

Firstly, modes for carrying out the present disclosure will be listed and described.

The circuit assembly of the present disclosure is (1) a circuit assembly including: a lower case for accommodating lower circuit components; an upper case covering the lower case; upper circuit components attached onto an upper wall of the upper case; and a fastening member holder for holding a fastening member for fixing the upper circuit components to the upper wall of the upper case, the fastening member holder being provided in the upper wall of the upper case and opening upward.

According to the circuit component of the present disclosure, the upper case is provided with the fastening member holder for holding the fastening member for fixing the upper circuit components attached to the upper case. The fastening member holder fixes the upper circuit components to the upper case. For this reason, the fastening member holder does not limit the layout space in the lower case. The lower circuit components can be laid out in the lower case with high design flexibility and higher spatial efficiency. This makes it possible to flexibly deal with the demand for reducing the size of the circuit assembly.

Note that the upper circuit components include electrical components such as a relay and a fuse for a high-voltage circuit, and conductive bus bars or the like that are connected to these electrical components. The lower circuit components include electrical components such as a low-voltage circuit, conductive bus bars connected to these electrical components, heat-dissipating bus bars connected to a connecting portion of a heat-generating component such as the relay attached to the upper case, or the like. The fastening members may be a pair of known fastening members such as a bolt and a nut, and either one of these two fastening members is accommodated in the corresponding fastening member holder.

(2) It is preferable that the fastening member holder overlaps the lower circuit components in a direction in which the upper case and the lower case are stacked. The fastening member holders can be overlapped with the lower circuit components in the vertical direction, namely the direction in which the lower case and the upper case are stacked. Such overlapping was difficult with conventional structures. The above configuration makes it possible to further reduce the circuit assembly size and further improve the spatial efficiency of the lower case.

(3) It is preferable that the upper case has a plurality of the fastening member holders, and the plurality of fastening member holders are arranged close to each other in a projection in a first direction, and are spaced apart from each other in a projection in a second direction that is orthogonal to the first direction. This is because the fastening member holders can be laid out in a space-saving manner in the upper case, and the circuit assembly size can be further reduced. Note that "close to each other in a projection in the first direction" includes a mode in which the plurality of fastening member holders are arranged with small gaps therebetween, and a mode in which the plurality of fastening member holders are arranged in an overlapping manner.

(4) In the configuration described in the item (3) above, it is preferable that the lower circuit components include a lower current-carrying bus bar, and the lower current-carrying bus bar is inserted and laid out in a space below the plurality of fastening member holders. This is because a space below the plurality of fastening member holders, which was conventionally a dead space, can be used as a space for laying out the lower current-carrying bus bar, and the lower current-carrying bus bar can be laid out in the lower case with yet higher spatial efficiency.

(5) It is preferable that the upper circuit components include a heat-generating component and an upper current-carrying bus bar, the lower circuit components include a heat-dissipating bus bar, the upper current-carrying bus bar and the heat-dissipating bus bar are connected to a connecting portion of the heat-generating component, and an end portion of the heat-dissipating bus bar is arranged in an extending manner below the fastening member holder that fixes the upper current-carrying bus bar. The heat-dissipating bus bar can be extended using a space below the fastening member holder for fixing the upper current-carrying bus bar. In the conventional structure, the fastening member holders limited the extension of the heat-dissipating bus bar. With the present configuration, heat dissipation of a heat-generating component attached to the upper case can be advantageously improved using the space in the lower case. Note that the heat-generating component may be a component that generates heat in response to current flowing through it, such as a relay or a fuse.

Details of Embodiments of Present Disclosure

Specific examples of the circuit assembly of the present disclosure will be described below with reference to the drawings. It should be noted that the present disclosure is not limited to these examples but is indicated by the claims, and is intended to include all the changes made within the meaning and scope equivalent to the claims.

Embodiment 1

Embodiment 1 of the present disclosure will be described below with reference to FIGS. 1 to 8. A circuit assembly 10 is installed in a vehicle (not shown) such as an electric vehicle or a hybrid vehicle, and is configured to supply electric power from a power supply 12, such as a battery, to a load 14, such as a motor, and control these components (see FIG. 6). Although there is no limitation to the orientation of the circuit assembly 10 when installed in the vehicle, the upward direction in the following description is the Z direction in FIG. 1, the forward direction is the X direction in FIG. 1, and the leftward direction is the Y direction in FIG. 1. When there are a plurality of identical members, only some of them may be assigned a reference numeral, and the reference numerals of the others may be omitted.

Schematic Circuit Configuration of Circuit Assembly 10

Figure 6:
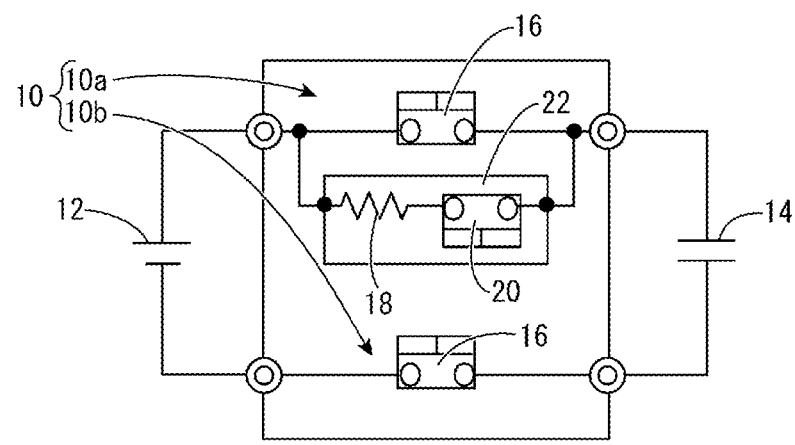
FIG. 6 schematically shows an electrical configuration of a path from a power supply to a load in the circuit assembly shown in FIG. 1.

The circuit assembly 10 includes a circuit assembly 10a provided on the positive side, and a circuit assembly 10b provided on the negative side, as shown in FIG. 6. The positive side of the power supply 12 is connected to the input side of the circuit assembly 10a. The negative side of the power supply 12 is connected to the input side of the circuit assembly 10b. The positive side of the load 14 is connected to the output side of the circuit assembly 10a. The negative side of the load 14 is connected to the output side of the circuit assembly 10b. A relay 16, which is a heat-generating component that connects the power supply 12 to the load 14, is connected between the input side and the output side of each of the circuit assembly 10a and the circuit assembly 10b. In addition, the relay 16 that connects the positive side of the power supply 12 to the positive side of the load 14 is connected to a precharge circuit 22 in which a precharge resistor 18 and a precharge relay 20 are connected in series to bypass the relay 16.

In Embodiment 1 of the present disclosure, the precharge resistor 18 is connected to the input side of the precharge relay 20, as shown in FIG. 6. The relays 16 and the precharge relay 20 are relays that move a contact portion with an excitation coil in an energized state to switch on and off the contact portion, and are turned on and off by a control circuit (not shown).

Circuit Assembly 10

Figure 3:
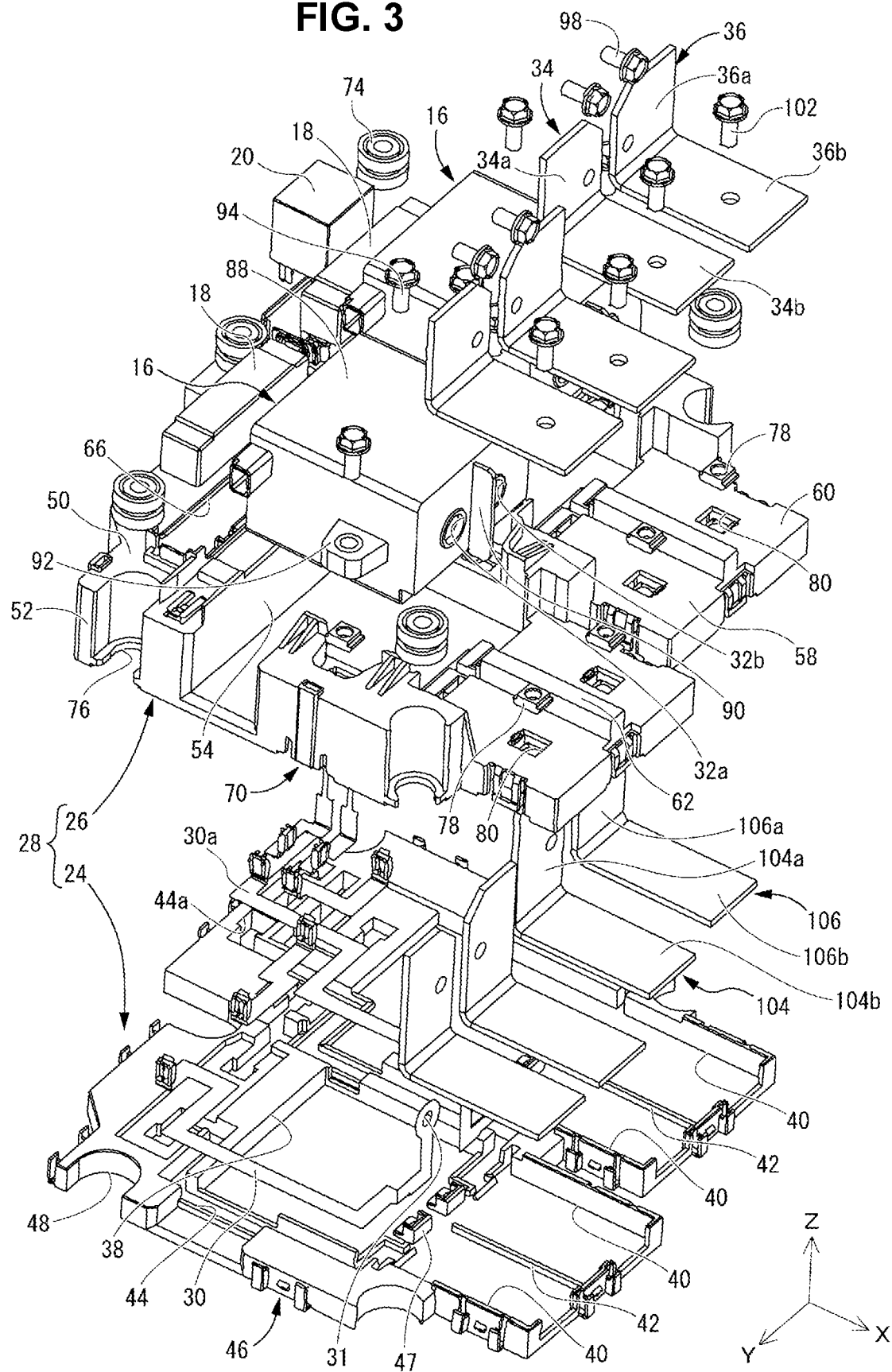
FIG. 3 is an exploded perspective view of the circuit assembly shown in FIG. 1.

The circuit assembly 10 includes, for example, a lower case 24 that is located on the lower side when the circuit assembly 10 is installed in a vehicle, and an upper case 26 that is located on the upper side, as shown in FIG. 3. The lower case 24 and the upper case 26 constitute an insulating base member 28. The base member 28 accommodates low-voltage bus bars 30, which serve as lower current-carrying bus bars that connect the relay 16 to the precharge circuit 22 and connect components in the precharge circuit 22. A plurality of low-voltage bus bars 30 are provided in Embodiment 1. Further, the base member 28 includes the two relays 16, and conductive bus bars 34 and 36, which serve as upper current-carrying bus bars connected to respective connecting portions 32a and 32b of the relays 16. These conductive bus bars 34 and 36 carry larger currents than the currents in the low-voltage bus bars 30 for the precharge circuit 22.

Note that there is no limitation to the shape of the low-voltage bus bars 30, and they may be designed as appropriate in accordance with the position or the like of the relays 16, the precharge resistor 18, and the precharge relay 20 in the base member 28. In Embodiment 1, the plurality of low-voltage bus bars 30 includes a low-voltage bus bar 30a, which extends in the front-back direction between the two relays 16 at the center of the base member 28 in the left-right direction. An end portion of the low-voltage bus bars 30 and 30a connected to the relays 16 is bent upward. An upper end portion of this bent section has an open hole 31 that is open in the thickness direction of the bent section (front-back direction). The open holes 31 are aligned with the connecting portions 32a and 32b of the relays 16 when relays 16 are fitted to the base member 28, as will be described later.

Lower Case 24

Figure 7:
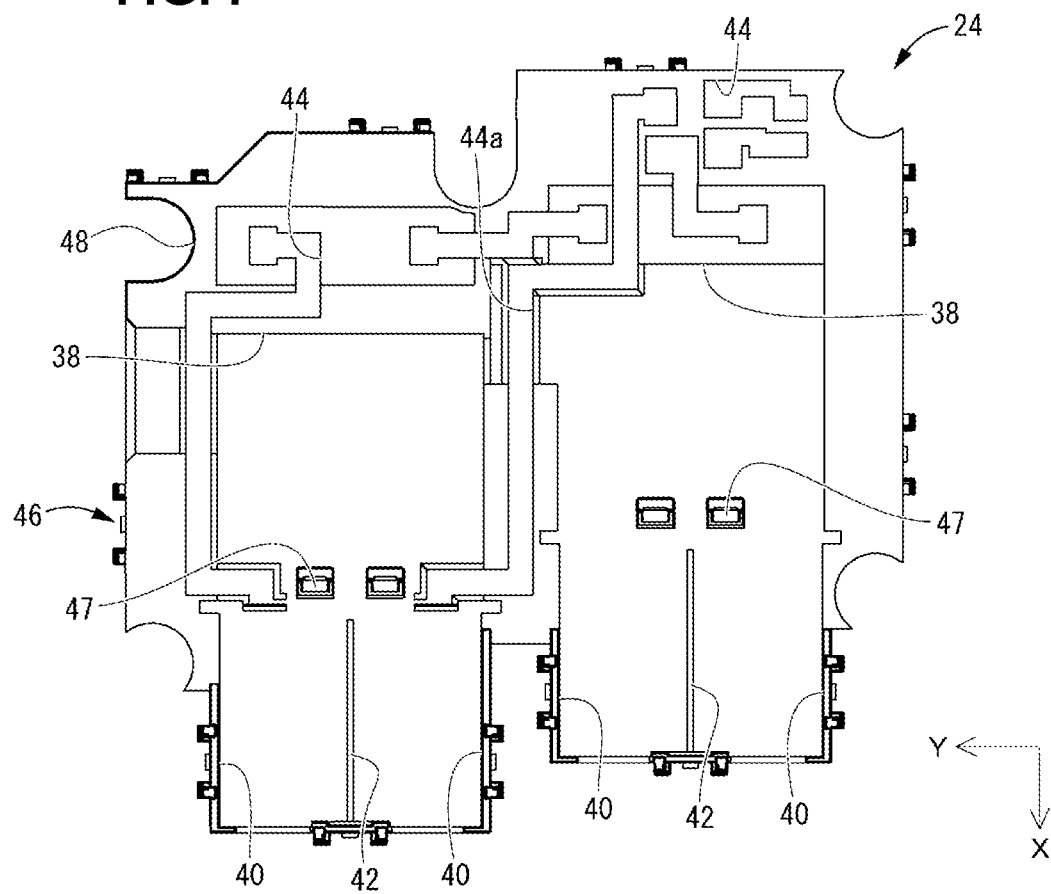
FIG. 7 is a plan view of a lower case constituting the circuit assembly shown in FIG. 1.

The lower case 24 is made by injection-molding an insulating synthetic resin into a predetermined shape. The synthetic resin that constitutes the lower case 24 may contain a filler such as glass fiber. For example, a material with good thermal conductivity may be preferably employed. The lower case 24 of Embodiment 1 has a flat rectangular shape as a whole in a plan view, as is also shown in FIG. 7. Two recessed portions 38 are arranged next to each other in the left-right direction at the center of the lower case 24 in the front-back direction, and are open upward. The recessed portions 38 each have a substantially rectangular shape in a plan view. The relays 16 are accommodated in the upper case 26 at positions overlapping the recessed portions 38 in the vertical direction.

Bus bar accommodating recessed portions 40 in which later-described heat-dissipating bus bars 104 and 106 are accommodated are provided in front of each recessed portion 38. In Embodiment 1, bottom faces of the recessed portions 38 and bottom faces of the bus bar accommodating recessed portions 40 are located at substantially the same height at a position lower than an upper face of the lower case 24. The bottom faces of the bus bar accommodating recessed portions 40 extend forward, substantially continuously from the bottom faces of the recessed portions 38. The bus bar accommodating recessed portions 40 are arranged next to each other in the left-right direction. A partitioning portion 42 that extends in the front-back direction is provided at a position between the bus bar accommodating recessed portions 40 in the left-right direction. Thus, the bus bar accommodating recessed portions 40 next to each other in the left-right direction are substantially independent from each other. This configuration prevents electrical short circuits arising from contact between the heat-dissipating bus bars 104 and 106 accommodated in the bus bar accommodating recessed portions 40. In Embodiment 1, two relays 16 are provided. Therefore, a total of four bus bar accommodating recessed portions 40 are arranged substantially in parallel in the left-right direction, at a front edge part of the base member 28.

In the lower case 24, bus bar accommodating grooves 44 for accommodating the low-voltage bus bars 30 are provided and open upward at positions separated from the recessed portions 38 and the bus bar accommodating recessed portions 40. That is, lower circuit components to be accommodated in the lower case 24 include the low-voltage bus bars 30. The bus bar accommodating grooves 44 are formed in accordance with the shape of the low-voltage bus bars 30. In Embodiment 1, a plurality of bus bar accommodating grooves 44 are provided. Particularly, in Embodiment 1, the plurality of bus bar accommodating grooves 44 include a bus bar accommodating groove 44a for accommodating the low-voltage bus bar 30a that is laid out in a space between the two relays 16 in the left-right direction, at the center of the lower case 24 in the left-right direction.

A plurality of lower engaging portions 46 are provided on an outer peripheral wall of the lower case 24. The lower engaging portions 46 engage with upper engaging portions 70 that are provided on a later-described outer peripheral wall of the upper case 26 such that the lower case 24 and the upper case 26 are fixed to each other. The lower case 24 also includes lower engaging portions 47 in spaces between the recessed portions 38 and the bus bar accommodating recessed portions 40 in the front-back direction. The lower engaging portions 47 engage with later described upper engaging portions 72 that are provided in the upper case 26. Note that there is no limitation to the way the lower engaging portions 46 and 47 engage the upper engaging portions 70 and 72, and this may be, for example, fitting between recessed and protruding portions. Further, the outer peripheral wall of the lower case 24 has a recessed portion 48, which is a cutout, at a position corresponding to a later-described catch portion 74 that is provided in the upper case 26. The catch portion 74 is positioned within the recessed portion 48.

Upper Case 26

Figure 8:
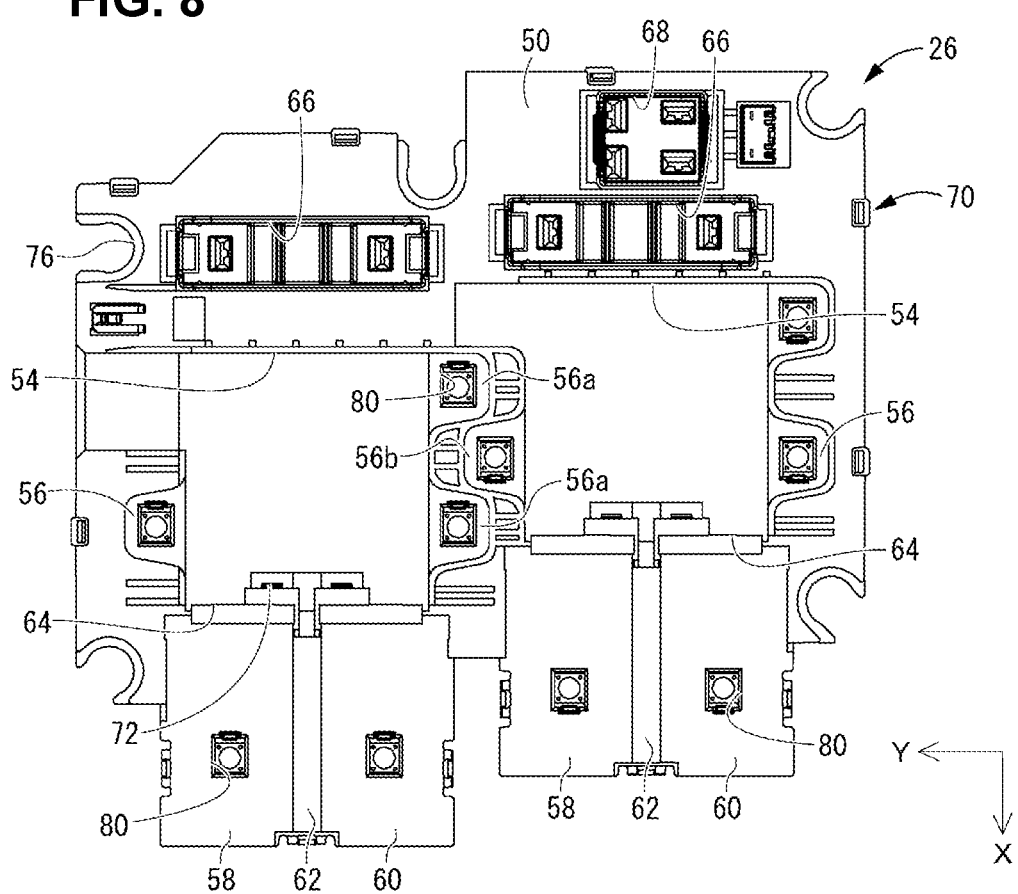
FIG. 8 is a plan view of an upper case constituting the circuit assembly shown in FIG. 1.

The upper case 26 is made by injection-molding an insulating synthetic resin into a predetermined shape. The synthetic resin that constitutes the upper case 26 may contain a filler such as glass fiber. The upper case 26 has what is substantially a box shape that is open downward as a whole, and has an upper wall 50 having substantially the same shape as the lower case 24, and a peripheral wall 52 that protrudes downward from an outer peripheral edge portion of the upper wall 50, as is also shown in FIG. 8.

The upper case 26 includes relay accommodating portions 54 for accommodating the relays 16. Each relay accommodating portion 54 has a substantially rectangular recessed shape that is open upward. In Embodiment 1, a relay accommodating portion 54 for accommodating a relay 16 on the positive side and a relay accommodating portion 54 for accommodating a relay 16 on the negative side are formed at a certain distance in the left-right direction at the center in the front-back direction. Bottom faces of these relay accommodating portions 54 have a substantially flat face expanding in a horizontal plane (XY plane), and are provided at positions lower than the upper wall 50. The relays 16 are accommodated in the relay accommodating portions 54 such that the connecting portions 32a and 32b of the relays 16 face forward.

Furthermore, leg support portions 56 for supporting later-described leg portions 92 of the relays 16 are provided on both sides of each relay accommodating portion 54 in the left-right direction. In Embodiment 1, the leg support portions 56 are also provided in a space between the relay accommodating portions 54 in the left-right direction. Particularly, in Embodiment 1, leg support portions 56a provided on the right side of the left relay accommodating portion 54 and a leg support portion 56b provided on the left side of the right relay accommodating portion 54 overlap each other in a projection in the front-back direction. Specifically, two leg support portions 56a that are spaced apart from each other in the front-back direction, are provided on the right side of the left relay accommodating portion 54. Also, one leg support portion 56b is provided on the left side of the right relay accommodating portion 54. The leg support portion 56b is sandwiched between the leg support portions 56a that are spaced apart from each other in the front-back direction. That is, a plurality of leg support portions 56a and 56b are spaced apart from each other, or partially overlap each other, in the front-back direction serving as a first direction, and overlap each other in the left-right direction serving as a second direction orthogonal to the first direction, in a space between the relay accommodating portions 54 in the left-right direction.

Bus bar supporting portions 58 and 60 for supporting the conductive bus bars 34 and 36 are provided in front of each relay accommodating portion 54. The bus bar supporting portions 58 and 60 have a substantially rectangular shape in a plan view, and are substantially adjacent to each other in the left-right direction. A partition wall portion 62 that extends in the front-back direction is provided in the space between the bus bar supporting portions 58 and 60 in the left-right direction. Thus, the bus bar supporting portions 58 and 60 are substantially independent from each other. This configuration prevents electrical short circuits arising from contact between the conductive bus bars 34 and 36 supported by the bus bar supporting portions 58 and 60.

Upper faces of the bus bar supporting portions 58 and 60 are substantially rectangular flat faces expanding in a horizontal plane, and are located above bottom faces of the relay accommodating portions 54. The bottom faces of the relay accommodating portions 54 and the upper faces of the bus bar supporting portions 58 and 60 are spaced apart from each other in the front-back direction. Thus, open windows 64, each having a substantially rectangular shape in a plan view, pass through the upper wall 50 in the vertical direction, in spaces between the bottom face of the relay accommodating portion 54 and the upper faces of the bus bar supporting portions 58 and 60 in the front-back direction.

Further, in the upper wall 50 of the upper case 26, precharge resistor attachment portions 66 for attaching the precharge resistor 18, and a precharge relay attachment portion 68 for attaching the precharge relay 20 are provided behind the relay accommodating portions 54 and open upward. In other words, in Embodiment 1, upper circuit components to be attached to the upper case 26 include the relays 16 and the conductive bus bars 34 and 36, and may also include the p recharge resistor 18 and the p recharge relay 20.

Upper engaging portions 70 are provided at portions of a lower end portion of the peripheral wall 52 that correspond to the lower engaging portions 46 of the lower case 24. Further, the upper case 26 has claw-shaped upper engaging portions 72 that protrude downward, in spaces between the relay accommodating portions 54 and the bus bar supporting portions 58 and 60 in the front-back direction. Moreover, a catch portion 74 having a bolt insertion hole that passes in the vertical direction is provided at a position separated from the upper engaging portions 70 in a circumferential direction, on the lower end portion of the peripheral wall 52. The catch portion 74 is a substantially cylindrical member separate from the upper case 26. A portion of the catch portion 74 that has a smaller diameter at the center in the vertical direction is fitted to the cutout recessed portion 76 provided in the upper case 26, and the catch portion 74 is thus fixed to the upper case 26.

Fastening Member Holder 80

In Embodiment 1, the upper circuit components (the relays 16 and the conductive bus bars 34 and 36) are fixed to the upper case 26 by means of a bolt-nut structure. In other words, the leg support portions 56, 56a, and 56b and the bus bar supporting portions 58 and 60 of the upper case 26 are provided with fastening member holders 80, each having a recessed shape, for holding nuts 78 serving as fastening members. That is, a plurality of fastening member holders 80 are provided, and a nut 78 is accommodated in each of these fastening member holders 80.

Figure 4:
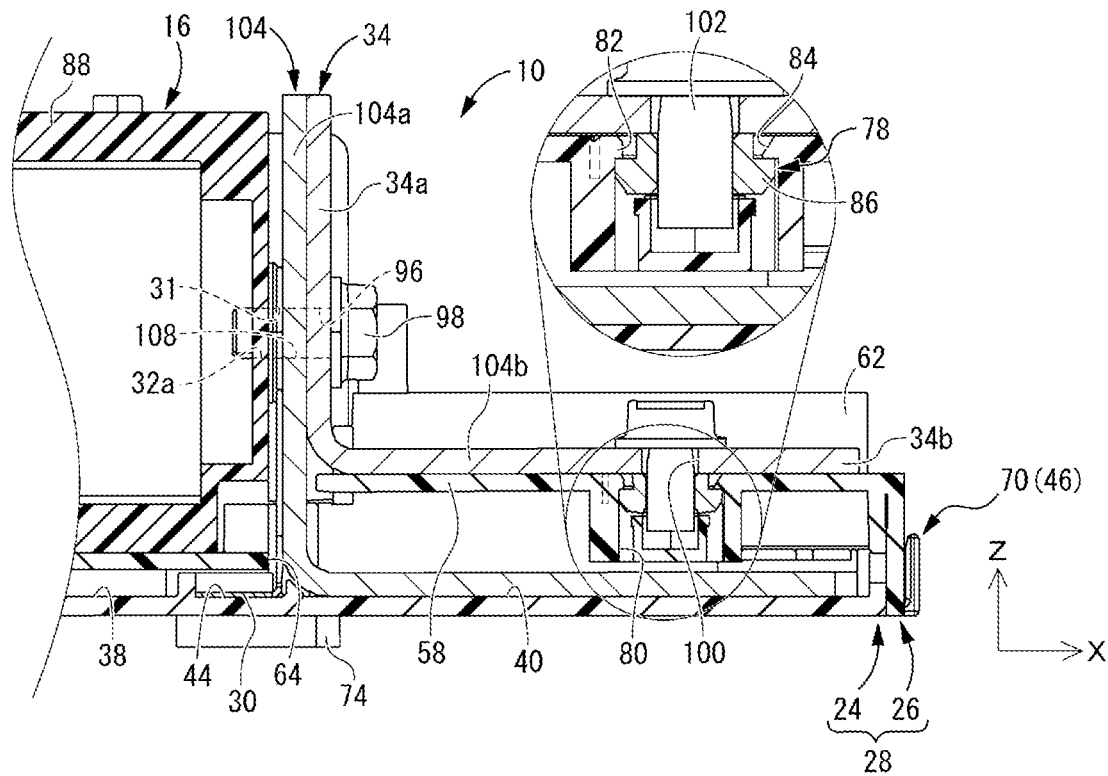
FIG. 4 is a vertical cross-sectional view in which a main part in a Iv-Iv cross section of FIG. 2 is enlarged.
Figure 5:
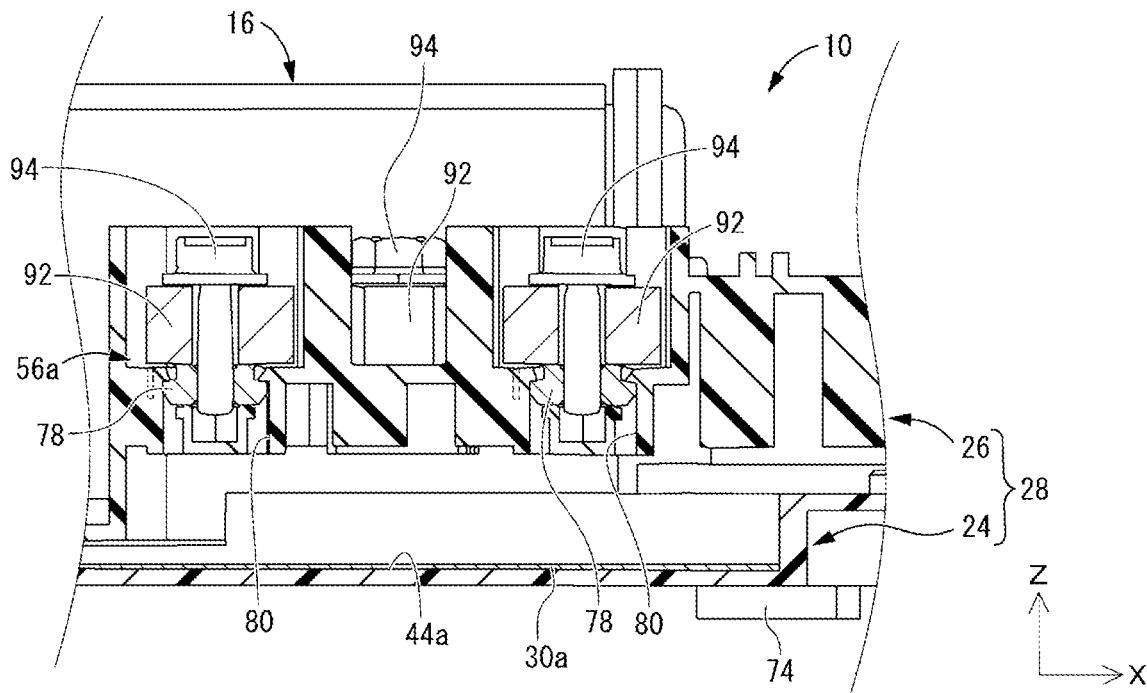
FIG. 5 is a vertical cross-sectional view in which a main part of a v-v cross-section of FIG. 2 is enlarged.

The fastening member holders 80 are recessed portions having a substantially rectangular shape in a plan view, as is also shown in FIGS. 4 and 5. A nut 78 is fitted to each fastening member holder 80, and is fixed by means of fitting between recessed and protruding portions in Embodiment 1. Specifically, an elastic piece 82, which is elastically deformable in the front-back direction, is provided at a wall portion on one side in the front-back direction (a back wall portion constituting the fastening member holder 80 in FIG. 4) in the opening of the fastening member holder 80. An inclined face 84 is provided in a wall portion on the other side in the front-back direction (a front wall portion constituting the fastening member holder 80 in FIG. 4). Further, the nut 78 has protruding portions 86 that protrude on both sides in the front-back direction. Accordingly, the nut 78 is guided into the fastening member holder 80 as a result of the inclined face 84 coming into contact with one of the protruding portions 86 when the nut 78 is fitted into the fastening member holder 80. Also, the nut 78 can be inserted into the fastening member holder 80 by elastically deforming the elastic piece 82 using the other protrusion portion 86. The nut 78 is fixed within the fastening member holder 80 as a result of the elastic piece 82 being elastically restored after the nut 78 has been arranged within the fastening member holder 80.

The fastening member holders 80 are provided at substantially central parts of the upper faces of the bus bar supporting portions 58 and 60. The fastening member holders 80 are also provided at substantially central parts of the leg support portions 56a and 56b located in a space between the two relays 16 in the left-right direction. Here, the plurality of fastening member holders 80 provided in the leg support portions 56a and 56b are arranged close to each other in a projection in the front-back direction, which is the first direction of the upper case 26. Further, the plurality of fastening member holders 80 provided in the leg support portions 56a and 56b are spaced apart from each other in a projection in the left-right direction of the upper case 26, which is the second direction orthogonal to the first direction. The bus bar accommodating groove 44a located in a space in the left-right direction between the two recessed portions 38 in the left-right direction in the lower case 24, and the low-voltage bus bar 30a accommodated in the bus bar accommodating groove 44a are located below the plurality of fastening member holders 80. Accordingly, in Embodiment 1, the fastening member holders 80 and the low-voltage bus bar 30a overlap each other in the vertical direction, which is the direction in which the lower case 24 and the upper case 26 are stacked.

Relay 16

The relays 16 are mechanical relays, and are turned on and off by a control circuit (not shown). Each relay 16 has a relay body 88 having a substantially hollow rectangular-parallelepiped shape as a whole, as is also shown in FIG. 3, and has a contact portion and a coil portion (not shown) within the relay body 88. Since the left relay 16 and the right relay 16 have the same structure, the left relay 16 is described in the following description, and a description of the right relay 16 is omitted. A pair of open holes are formed in a front end wall of the relay body 88 and are spaced apart from each other in the left-right direction. These open holes constitute the aforementioned connecting portions 32a and 32b of the relay 16.

The contact portion of the relay 16 generates heat in response to a current flowing between the connecting portions 32a and 32b via the contact portion when the relay 16 is energized (i.e., current flows through it). Note that a partition plate portion 90 that protrudes forward is formed between the connecting portions 32a and 32b, extending over the substantially entire length of the relay body 88 in the vertical direction. This configuration prevents electrical short circuit from occurring due to contact between the conductive bus bar 34, which is connected to the connecting portion 32a on the positive side, and the conductive bus bar 36, which is connected to the connecting portion 32b on the negative side.

The relay body 88 has a plurality of (three in this embodiment) leg portions 92 that protrude toward both sides in the left-right direction. These leg portions 92 each have a bolt insertion hole. The relay 16 is attached to the upper case 26 by inserting fixing bolts 94 into the bolt insertion holes and fastening the fixing bolts 94 to the nuts 78 provided in the fastening member holders 80 in the upper case 26 with the nuts 78 aligned with the bolt insertion holes in the leg portions 92. In other words, the fastening members for fixing the relay 16, which is an upper circuit component, to the upper case 26 include the fixing bolts 94 in addition to the nuts 78.

Conductive Bus Bars 34 and 36

The two bus bars 34 and 36 are formed by processing conductive metal sheet materials. The conductive bus bars 34 and 36 are bent in what is substantially an L-shape, as is also shown in FIG. 3. One side of the bent sections extends in the vertical direction to form first connecting portions 34a and 36b each having a substantially rectangular plate shape that are connected respectively to the connecting portions 32a and 32b of the relay 16. The first connecting portions 34a and 36a each have a bolt insertion hole 96 that passes in the front-back direction, which is the plate thickness direction, as is also shown in FIG. 4. The conductive bus bars 34 and 36 are at least electrically connected to the connecting portions 32a and 32b of the relay 16 as a result of bolts 98 being fastened to the connecting portions 32a and 32b of the relay 16.

The other side of the bent sections of the conductive bus bars 34 and 36 extends forward. These extending portions serve as second connecting portions 34b and 36b. The second connecting portions 34b and 36b each have a substantially rectangular shape, and each have a bolt insertion hole 100 that passes in the vertical direction, which is the plate thickness direction. These bolt insertion holes 100 are aligned with the nuts 78 provided in the fastening member holders 80 when the second connecting portions 34b and 36b of the conductive bus bars 34 and 36 are overlapped with the bus bar supporting portions 58 and 60. Then, terminal portions or the like at electric wire terminals (not shown) are stacked on top of the second connecting portions 34b and 36b of the conductive bus bars 34 and 36, and fixing bolts 102 are inserted into the bolt insertion holes 100 and fastened to the nuts 78. Thus, the conductive bus bars 34 and 36 are fixed to the upper case 26, and the electric wires are electrically connected to the conductive bus bars 34 and 36. That is, fastening members for fixing the conductive bus bars 34 and 36, which are upper circuit components, to the upper case 26 include the fixing bolts 102 in addition to the nuts 78.

Heat-Dissipating Bus Bars 104 and 106

In Embodiment 1, the heat-dissipating bus bars 104 and 106, as well as the conductive bus bars 34 and 36, are connected to the connecting portions 32a and 32b of the relay 16, which is a heat-generating component, as is also shown in FIG. 4 and other figures. The heat-dissipating bus bars 104 and 106 are at least thermally connected to the connecting portions 32a and 32b of the relay 16.

The two heat-dissipating bus bars 104 and 106 are formed by processing heat-conductive metal sheet materials. The heat-dissipating bus bars 104 and 106 are bent closed-end into an L-shape, similarly to the conductive bus bars 34 and 36. One side of the bent sections extends in the vertical direction to form first plate-shaped portions 104a and 106a having a substantially rectangular plate shape that are connected respectively to the connecting portions 32a and 32b of the relay 16. The first plate-shaped portions 104a and 106a each have a bolt insertion hole 108 that passes in the front-back direction, which is the plate thickness direction.

The other side of the bent sections of the heat-dissipating bus bars 104 and 106 extends forward. These extending portions serve as second plate-shaped portions 104b and 106b each having a substantially rectangular shape. During later-described assembly, the heat-dissipating bus bars 104 and 106 are accommodated in the bus bar accommodating recessed portions 40 as a result of the second plate-shaped portions 104b and 106b of the heat-dissipating bus bars 104 and 106 being stacked on top of the bottom faces of the bus bar accommodating recessed portions 40 of the lower case 24. Accordingly, the lower circuit components to be accommodated in the lower case 24 include the heat-dissipating bus bars 104 and 106 in addition to the low-voltage bus bars 30 and 30a.

In Embodiment 1, the second plate-shaped portions 104b and 106b of the heat-dissipating bus bars 104 and 106 have a length in the front-back direction that is substantially equal to that of the bus bar accommodating recessed portions 40. Further, the second plate-shaped portions 104b and 106b of the heat-dissipating bus bars 104 and 106 extend forward relative to the bolt insertion holes 100 in the conductive bus bars 34 and 36, which are located above the heat-dissipating bus bars 104 and 106. In other words, the heat-dissipating bus bars 104 and 106 are located below the fastening member holders 80 that hold the nuts 78 fixing the conductive bus bars 34 and 36. Also, end portions of the second plate-shaped portions 104b and 106b extend forward relative to the fastening member holders 80. Particularly, in Embodiment 1, the second plate-shaped portions 104b and 106b have a length in the front-back direction that is substantially equal to that of the second connecting portions 34b and 36b of the conductive bus bars 34 and 36.

Assembly Process of Circuit Assembly 10

Next, an example of an assembly process of the circuit assembly 10 will be described. The assembly process of the circuit assembly 10 is not limited to the following description.

First, the lower case 24 and the upper case 26 that constitute the base member 28 are prepared. Next, the low-voltage bus bars 30 and 30a are accommodated in the bus bar accommodating grooves 44 and 44a of the lower case 24. Also, the heat-dissipating bus bars 104 and 106 are accommodated in the bus bar accommodating recessed portions 40. Then, the upper case 26 to which the catch portion 74 and the nuts 78 have been fitted is stacked on top of the lower case 24 from above, and the lower engaging portions 46 and 47 are engaged with the upper engaging portions 70 and 72. Thus, the lower case 24 is covered by the upper case 26, thereby forming the base member 28. When the lower case 24 is fitted to the upper case 26, the first plate-shaped portions 104a and 106a of the heat-dissipating bus bars 104 and 106 protrude upward from the upper case 26 through the open windows 64 provided in the upper case 26. Note that the catch portion 74 and the nuts 78 may alternatively be fitted to the upper case 26 after the lower case 24 has been fitted to the upper case 26.

The relay 16 are arranged in the corresponding relay accommodating portion 54 of the upper case 26, and the relay 16 is fixed to the upper case 26 with the fixing bolts 94. Next, the low-voltage bus bars 30, the conductive bus bars 34 and 36, and the heat-dissipating bus bars 104 and 106 are connected to the connecting portions 32a and 32b of the two relays 16. Note that the left relay 16 will be described below.

The relay 16 is arranged in the relay accommodating portion 54 of the upper case 26. Thus, the connecting portions 32a and 32b of the relay 16, the open holes 31 in the low-voltage bus bars 30 and 30a, and the bolt insertion holes 108 provided in the first plate-shaped portions 104a and 106a of the heat-dissipating bus bars 104 and 106 are aligned with each other. Also, the conductive bus bars 34 and 36 are arranged in the bus bar supporting portions 58 and 60 of the upper case 26. The first connecting portions 34a and 36a of the conductive bus bars 34 and 36 are stacked, in the front-back direction, with the first plate-shaped portions 104a and 106a of the heat-dissipating bus bars 104 and 106. Thus, the bolt insertion holes 96 in the conductive bus bars 34 and 36 are aligned with the bolt insertion holes 108 in the heat-dissipating bus bars 104 and 106.

Next, the bolts 98 are inserted and fastened to the connecting portions 32a and 32b, the open holes 31, the bolt insertion holes 96, and the bolt insertion holes 108. Thus, the low-voltage bus bars 30 and 30a, the conductive bus bars 34 and 36, and the heat-dissipating bus bars 104 and 106 are bolted to the connecting portions 32a and 32b of the relay 16. In other words, the low-voltage bus bars 30 and 30a and the heat-dissipating bus bars 104 and 106 are fastened together using the bolts 98 that fix the conductive bus bars 34 and 36 to the relay 16. Thus, in Embodiment 1, the low-voltage bus bars 30 and 30a, the conductive bus bars 34 and 36, and the heat-dissipating bus bars 104 and 106 are in electrical and thermal contact with the connecting portions 32a and 32b of the relay 16.

The circuit assembly 10 is assembled through the above process. Note that electric power can be supplied to the relay 16 via the conductive bus bars 34 and 36 by stacking the terminal portions of electric wire terminals on top of the second connecting portions 34b and 36b of the conductive bus bars 34 and 36 and fastening the fixing bolts 102. The precharge resistor 18 and the precharge relay 20 are attached to the base member 28 at a suitable time.

The circuit assembly 10 can be attached to a vehicle by inserting an attachment bolt (not shown) into the bolt insertion hole in the catch portion 74 and fastening the circuit assembly 10 to, for example, a casing or the like of a battery pack (not shown) to which heat is to be radiated. Thus, heat generated due to energization of the relay 16 can be transmitted to the second plate-shaped portions 104b and 106b of the heat-dissipating bus bars 104 and 106 and radiated to the object to which the heat is to be radiated, such as the casing or the like of the battery pack, via the lower case 24.

In the circuit assembly 10 of Embodiment 1, the fixing bolts 94 and 102 for fastening the relay 16 and the conductive bus bars 34 and 36, which are the upper circuit components, are fastened to the nuts 78 provided in the fastening member holders 80 of the upper case 26. This configuration allows a sufficient space to be secured within the lower case 24 compared with a conventional structure in which the fastening member holders for accommodating the nuts are provided in the lower case. Design flexibility of the low-voltage bus bars 30 accommodated in the lower case 24 can thus be improved, for example. As a result, the space for laying out the low-voltage bus bars 30 can also be reduced, and not only the lower case 24 but also the entire circuit assembly 10 can be reduced in size.

Figure 2:
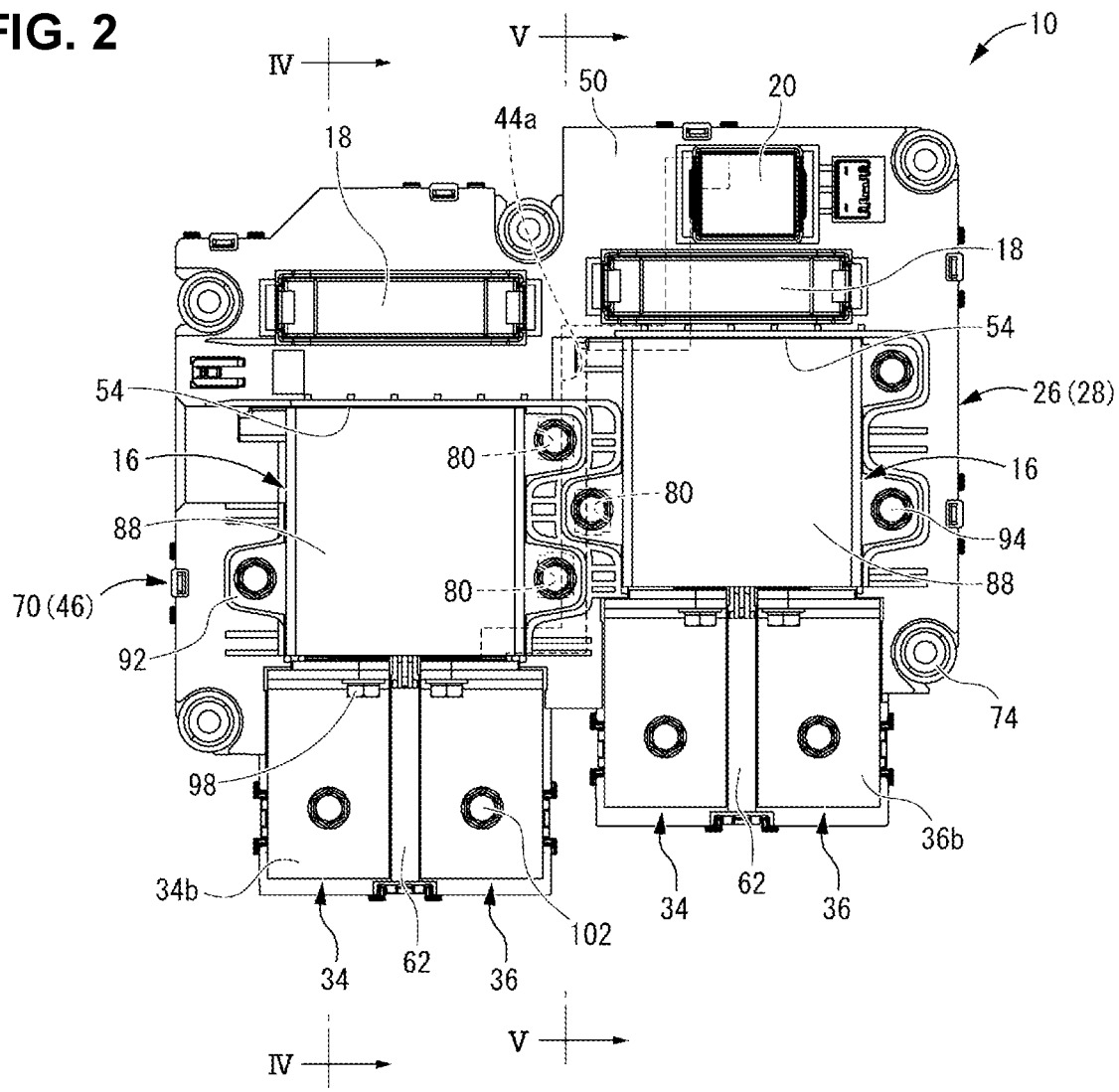
FIG. 2 is a plan view of the circuit assembly shown in FIG. 1.

The fastening member holders 80 overlap, in the vertical direction, the low-voltage bus bar 30a accommodated in the bus bar accommodating groove 44a, as shown in FIG. 2 in which the fastening member holders 80 and the bus bar accommodating groove 44a located between the left and right relays 16 are indicated by broken lines. That is, in Embodiment 1, the fixing bolts 94 for fixing the relay 16 are fastened to the nuts 78 provided in the upper case 26. Therefore, the low-voltage bus bar 30a can be laid even below the fixing bolts 94 and the fastening member holders 80 that accommodate the nuts 78.

Furthermore, in Embodiment 1, the plurality of fastening member holders 80 in the leg support portions 56a and 56b provided between the left and right relays 16 are close to each other in a projection in the first direction (front-back direction), and are spaced apart from each other in the second direction (left-right direction). This configuration reduces the separation distance between the left and right relays 16 and keeps the length of the upper case 26 in the left-right direction small. Particularly, in Embodiment 1, the separation distance between the left and right relays 16 can be reduced to the extent that the fastening member holders 80 can be arranged without being separated from each other in a projection in the left-right direction. Thus, a sufficient size reduction is achieved.

Particularly, in Embodiment 1, the plurality of fastening member holders 80 provided in these leg support portions 56a and 56b overlap the low-voltage bus bar 30a in the vertical direction. That is, the low-voltage bus bar 30a is inserted and laid out below the three fastening member holders 80. This configuration also reduces the length of the lower case 24 in the left-right direction and further reduces the size of the circuit assembly 10.

In Embodiment 1, the heat-dissipating bus bars 104 and 106 are accommodated in the lower case 24. This configuration makes it possible to design sufficiently large heat-dissipating bus bars 104 and 106. Specifically, the second plate-shaped portions 104b and 106b of the heat-dissipating bus bars 104 and 106 can be widely extended regardless of the positions of the fixing bolts 102 for fixing the conductive bus bars 34 and 36 and the positions of the fastening member holders 80 that accommodate the nuts 78. Accordingly, heat dissipation efficiency can be improved.

Other Embodiments

The technique described in the present specification is not limited to the embodiment described above and illustrated in the drawings. For example, the following embodiments are also included in the technical scope of the technique described in the present specification.

(1) In Embodiment 1, the fastening member holders 80 are provided and the nuts 78 are accommodated therein at all the fixing portions between the relay 16, the conductive bus bars 34 and 36, and the upper case 26. However, there is no limitation to this. That is, any one of the fastening member holders for fixing the upper circuit components need only be held by a fastening member holder provided in the upper case. In the other locations, bolts for fixing the upper circuit components may alternatively be fastened to the lower case, for example.

(2) In Embodiment 1, the fastening members held by the fastening member holders (fastening member holders 80) are the nuts 78. However, the fastening members may alternatively be bolts that protrude upward, for example, and head portions of the bolts may be fitted into the fastening member holders. In this case, the bolts are inserted from below into bolt insertion holes in the leg portion of the relay and the conductive bus bars, and the relay and the conductive bus bars can be fixed to the upper case by fastening nuts to the bolts from above. That is, the fastening member holders held by the fastening member holders may alternatively be either bolts or nuts.

(3) The means for holding the fastening members in the fastening member holders may alternatively be adhesive means or the like, instead of or in addition to fitting between recessed and protruding portions as in Embodiment 1. Alternatively, the fastening members and the fastening member holders (upper case) may be integrally formed by means of insert molding.

(4) Embodiment 1 has described, as an example, the relay 16 and the conductive bus bars 34 and 36 as the upper circuit components fixed to the upper case 26. However, there is no limitation thereto. The precharge relay, the precharge resistor, and the bus bar for a low-voltage circuit may also be fixed to the upper case.

(5) Embodiment 1 employs the relay 16 as a heat-generating component. However, a fuse may alternatively be employed instead of or in addition to the relay 16. Note that the heat-generating component is not essential to the present disclosure. Even when the heat-generating component is provided, a heat-dissipating mechanism is not essential. In the present disclosure, the heat-dissipating bus bars 104 and 106 are not essential. Even when the heat-dissipating mechanism is provided, the heat-dissipating mechanism need not be the heat-dissipating bus bars 104 and 106, and a conventionally known heat-dissipating mechanism may alternatively be provided separately.

(6) When a heat-dissipating mechanism such as that of Embodiment 1 is provided, a sheet- or paste-like heat conduction member may also be provided between the heat-dissipating bus bars 104 and 106 and the lower case 24 and/or between the lower case 24 and the object to which heat is to be radiated, for the purpose of improving heat conduction efficiency, for example.

LIST OF REFERENCE NUMERALS

10, 10*a*, 10*b* Circuit assembly (Embodiment 1)
12 Power supply
14 Load
16 Relay (heat-generating component, upper circuit component)
18 Precharge resistor
20 Precharge relay
22 Precharge circuit
24 Lower case
26 Upper case
28 Base member
30, 30*a* Low-voltage bus bar (lower circuit component, lower current-carrying bus bar)
31 Open hole
32*a*, 32*b* Connecting portion
34, 36 Conductive bus bar (upper circuit component, upper conductive bus bar)
34*a*, 36*a* First connecting portion
34*b*, 36*b* Second connecting portion
38 Recessed portion
40 Bus bar accommodating recessed portion
42 Partitioning portion
44, 44*a* Bus bar accommodating groove
46, 47 Lower engaging portion
48 Recessed portion
50 Upper wall
52 Peripheral wall
54 Relay accommodating portion
56, 56*a*, 56*b* Leg support portion
58, 60 Bus bar supporting portion
62 Partition wall portion
64 Open window
66 Precharge resistor attachment portion
68 Precharge relay attachment portion
70, 72 Upper engaging portion
74 Catch portion
76 Recessed portion
78 Nut (fastening member)
80 Fastening member holder
82 Elastic piece
84 Inclined face
86 Protrusion
88 Relay body
90 Partition plate portion
92 Leg portion
94 Fixing bolt (fastening member)
96 Bolt insertion hole
98 Bolt
100 Bolt insertion hole
102 Fixing bolt (fastening member)
104, 106 Heat-dissipating bus bar (lower circuit component)
104*a*, 106*a* First plate-shaped portion
104*b*, 106*b* Second plate-shaped portion
108 Bolt insertion hole

The invention claimed is:

1. A circuit assembly comprising:
a lower case for accommodating lower circuit components;
an upper case covering the lower case;
upper circuit components attached onto an upper wall of the upper case; and
a fastening member holder for holding a fastening member for fixing the upper circuit components to the upper wall of the upper case, the fastening member holder being provided in the upper wall of the upper case and opening upward,
wherein the fastening member holder is a recessed portion that is recessed from an upper face of the upper wall facing upward so as to have a bottom,
the fastening member includes a first fastening part and a second fastening part,
the first fastening part is entirely accommodated in the fastening member holder, and the second fastening part is fastened to the first fastening part accommodated in the fastening member holder and is entirely provided above the bottom of the recessed portion,
the upper circuit components include a heat-generating component and an upper current-carrying bus bar,
the lower circuit components include a heat-dissipating bus bar,
the upper current-carrying bus bar and the heat-dissipating bus bar are connected to a connecting portion of the heat-generating component, such that the heat dissipating bus bar contacts the connecting portion of the heat-generating component, and the upper current-carrying bus bar contacts the heat-dissipating bus bar, and
an end portion of the heat-dissipating bus bar is arranged in an extending manner below the fastening member holder that fixes the upper current-carrying bus bar.

2. The circuit assembly according to claim 1,
wherein the fastening member holder overlaps the lower circuit components in a direction in which the upper case and the lower case are stacked.

3. The circuit assembly according to claim 1,
wherein the upper case has a plurality of the fastening member holders, and
the plurality of fastening member holders are arranged close to each other in a first direction, and are spaced apart from each other in a second direction that is orthogonal to the first direction.

4. The circuit assembly according to claim 3,
wherein the lower circuit components include a lower current-carrying bus bar, and
the lower current-carrying bus bar is inserted and laid out in a space below the plurality of fastening member holders.

5. The circuit assembly according to claim 1, wherein
the upper face of the upper wall includes a bus bar holding portion on which the upper current-carrying bus bar is placed.

6. The circuit assembly according to claim 1, wherein
the first fastening part is a nut, and the second fastening part is a bolt.

7. The circuit assembly according to claim 1, wherein
in the opening of the fastening member holder, the fastening member holder includes an elastic piece extending inwardly from a wall of the fastening member holder, and an inclined face extending inwardly and downwardly from the wall of the fastening member holder, the wall extending between the upper wall face of the upper case and the bottom of the fastening member holder, the first fastening part includes a protruding portion protruding outwardly, the inclined face guides the protruding portion and the elastic piece is deformed in inserting the first fastening part into the fastening member holder, and the first fastening part is fixed within the fastening member holder by the elastic piece restored after the first fastening part is entirely accommodated into the fastening member holder.

* * * * *